(12) United States Patent
Siegel et al.

(10) Patent No.: US 7,099,417 B2
(45) Date of Patent: Aug. 29, 2006

(54) TRACE VIDEO FILTERING USING WAVELET DE-NOISING TECHNIQUES

(75) Inventors: Erwin Frederick Siegel, Windsor, CA (US); Keith Frederick Anderson, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 767 days.

(21) Appl. No.: 10/035,593

(22) Filed: Dec. 28, 2001

(65) Prior Publication Data

US 2003/0123584 A1 Jul. 3, 2003

(51) Int. Cl.
*H03K 7/02* (2006.01)

(52) U.S. Cl. .................. 375/350; 382/191; 382/260; 367/50

(58) Field of Classification Search .................. 375/350, 375/130, 232; 702/66, 17, 75, 127, 74; 382/191, 382/260; 367/50
See application file for complete search history.

(56) References Cited

U.S. PATENT DOCUMENTS

| | | | |
|---|---|---|---|
| 5,262,958 A * | 11/1993 | Chui et al. ............... | 702/75 |
| 5,285,165 A | 2/1994 | Renfors et al. | |
| 5,392,255 A * | 2/1995 | LeBras et al. ............ | 367/50 |
| 5,740,036 A * | 4/1998 | Ahuja et al. ............. | 702/17 |
| 5,784,285 A * | 7/1998 | Tamaki et al. ........... | 702/66 |
| 5,920,652 A * | 7/1999 | Wilkinson ................ | 382/260 |
| 6,219,373 B1 * | 4/2001 | Lee et al. ................. | 375/130 |
| 6,411,914 B1 * | 6/2002 | Mack ...................... | 702/74 |
| 6,539,319 B1 * | 3/2003 | Grichnik .................. | 702/75 |
| 6,556,939 B1 * | 4/2003 | Wegerich ................. | 702/127 |
| 6,741,739 B1 * | 5/2004 | Vincent ................... | 382/191 |
| 6,757,326 B1 * | 6/2004 | Prieto et al. ............. | 375/232 |
| 6,847,737 B1 * | 1/2005 | Kouri et al. ............. | 382/260 |

FOREIGN PATENT DOCUMENTS

| | | |
|---|---|---|
| EP | 0 343792 | 4/1989 |
| JP | 03247011 | 2/1990 |
| WO | WO 95/25382 | 3/1995 |

OTHER PUBLICATIONS

Shark et al.; Wavelet-Like Filter Banks: Design and Some Application Results; Signal Processing Proceedings, 2000. WCCC-ICSP 2000. 5th International Conference on vol. 1, Aug. 21-25, 2000 pp. 315-320.*

(Continued)

*Primary Examiner*—Emmanuel Bayard
*Assistant Examiner*—Sudhanshu C. Pathak

(57) ABSTRACT

A filter that includes an analyzer, thresholding circuit, and synthesizer. The analyzer generates a low-frequency component signal and a high-frequency component signal from an input signal. The thresholding circuit generates a processed high-frequency signal from the high-frequency component signal, the processed high-frequency signal having an amplitude of zero in those regions in which the high-frequency component signal has an amplitude that is less than a threshold value. The synthesizer generates a filtered signal from input signals that include the low-frequency component signal and the processed high-frequency signal. The filtered signal is identical to the input signal if the threshold value is zero. The analyzer is preferably constructed from a plurality of finite impulse response filters that operate on a small fraction of the input signal at a time.

12 Claims, 4 Drawing Sheets

OTHER PUBLICATIONS

Adler et al.; Eliminate Signal Noise with Discrete Wavelet Transformation; Electronic Design, Design Application; Sep. 5, 2000; pp. 1-15; www.elecdesign.com/Articles/ArticleID/4695/4695.html.*
Taswell; The What, How, and Why of Wavelet Shrinkage Denoising; Computing in Science and Engineering; vol. 2, No. 3; May/Jun. 2000; p. 12-19.*

Desai et al.; Adaptive Denoising Based on SURE Risk; IEEE Signal Processing Letters; Vol. %, No. 10; Oct. 1998; pp. 265-267.*
Donoho; De-Noising by Soft-Thresholding; IEEE Transcations on Information Theory; vol. 41, No. 3; May 1995; pp. 613-627.*
Patents Act 1977—Search Report Under Section 17 dated Aug. 22, 2003.

* cited by examiner

TRACE VIDEO FILTERING USING WAVELET DE-NOISING TECHNIQUES

FIELD OF THE INVENTION

The present invention relates to parameter measuring instruments such as on network analyzers, spectrum analyzers, and oscilloscopes, and more particularly, to a method for reducing the noise in the measurements displayed by such instruments.

BACKGROUND OF THE INVENTION

Swept-parameter instruments such as oscilloscopes display a graph of a measured quantity on a CRT or similar display device. The displayed measurement trace will typically exhibit noise that can be divided into trace noise and/or noise floor errors. The noise floor is the noise displayed when the measured signal has an amplitude of zero. The trace noise is the noise that depends on the amplitude and/or phase of the measured signal.

There are currently three methods used for noise reduction in such instrumentation. The first class of instruments reduces the noise errors by reducing the resolution bandwidth of the instrument. The resolution bandwidth is the equivalent noise bandwidth of an instrument. By reducing the resolution bandwidth, less noise is detected along with the signal of interest, resulting in less trace noise and a lower noise floor. While this method provides a more accurate measurement, the measurement speed is decreased due to increased signal processing time if the bandwidth reduction is implemented digitally. In addition, the instrument's transient response time is also reduced The second prior art method averages a number of traces together to reduce the noise errors. By averaging successive traces of data, measurement error due to noise is reduced. Averaging successive traces is equivalent to reducing the resolution bandwidth of the instrument using digital signal processing. While averaging results in more accurate measurements, the measurement speed is decreased due to the number of sweeps that must be taken.

The third method utilizes video filtering and smoothing techniques to reduce the noise displayed by the instrument. The video bandwidth is the equivalent bandwidth of the display trace process. Video filtering trace noise reduces the noise uncertainty. While video filtering is computationally efficient, it has two main problems. First, low pass filtering of the video signal smears signal details, and hence, introduces errors in those regions in which the signal is rapidly changing. Second, many instruments display the logarithm of the measured signal amplitude to provide a more useful display for signals that have large dynamic ranges. Prior art video filtering systems introduce errors in such displays near the noise floor.

Broadly, it is the object of the present invention to provide an improved filtering system and method for reducing noise errors in trace measurement instruments.

These and other objects of the present invention will become apparent to those skilled in the art from the following detailed description of the invention and the accompanying drawings.

SUMMARY OF THE INVENTION

The present invention is a filter that includes an analyzer, thresholding circuit, and synthesizer. The analyzer generates a low-frequency component signal and a high-frequency component signal from an input signal. The thresholding circuit generates a processed high-frequency signal from the high-frequency component signal, the processed high-frequency signal having an amplitude of zero in those regions in which the high-frequency component signal has an amplitude that is less than a threshold value. The synthesizer generates a filtered signal from input signals that include the low-frequency component signal and the processed high-frequency signal. The filtered signal is identical to the input signal if the threshold value is zero. The analyzer is preferably constructed from a plurality of finite impulse response filters that operate on a small fraction of the input signal at a time. The filter may include an input signal converter for generating the input signal from a measured signal by performing a mathematical transformation on the measured signal and an inverse converter for applying the inverse mathematical transformation to the filtered signal to generate an output signal. Input converters that generate a signal having an amplitude determined by the logarithm of the input signal or the square of the input signal are useful in removing noise from different portions of the input signal.

DETAILED DESCRIPTION OF THE INVENTION

Figure 1:
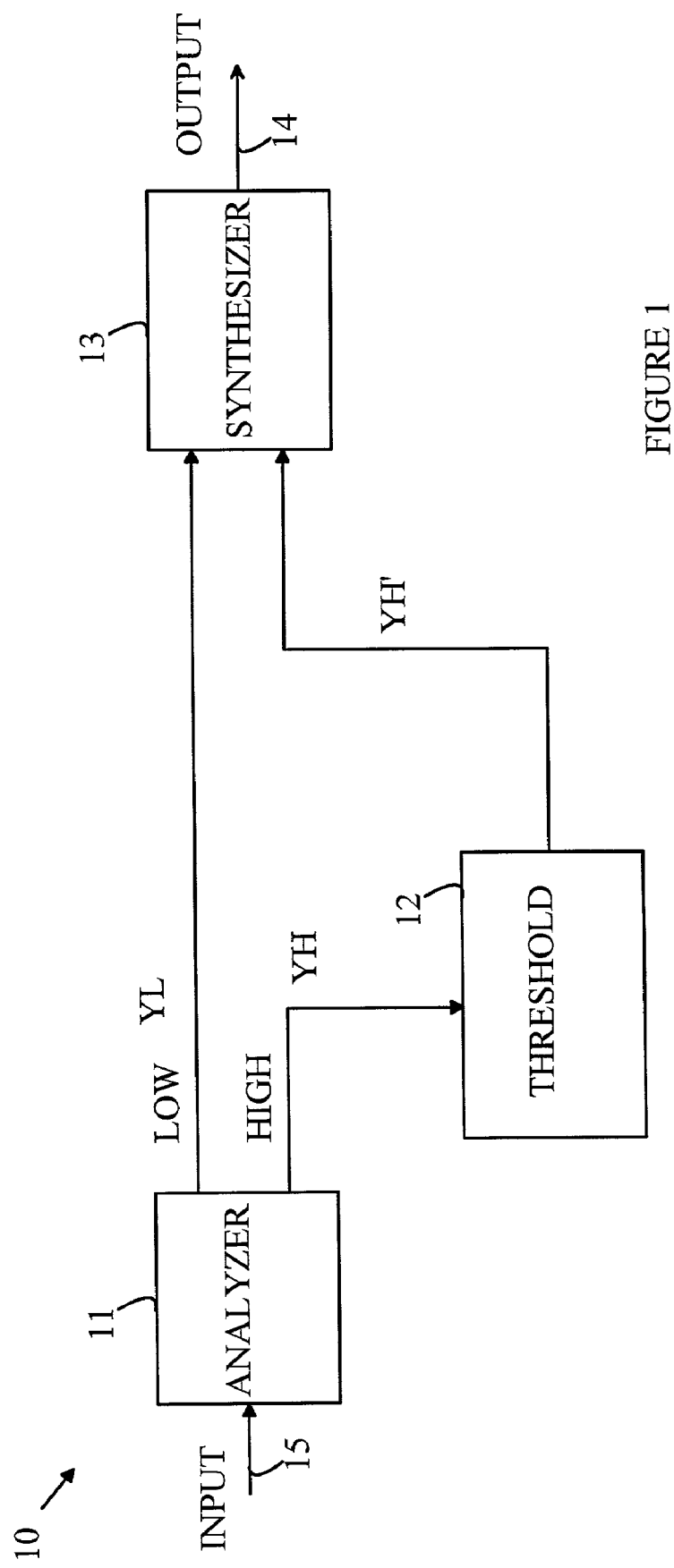
FIG. 1 is a block diagram of a simple wavelet-based filter bank 10 having one analyzer and one synthesizer.

The present invention uses Wavelet Transforms to implement a digital video filter which reduces the trace noise and noise floor of a measurement trace without the increased sweep times or measurement errors introduced by prior solutions.

To simplify the following discussion, the present invention will be explained in terms of the signal that is displayed to the user by a test instrument such as a network analyzer. This signal is typically displayed on a CRT or similar display device. However, it will be apparent to those skilled in the art from the following discussion that the de-noising system of the present invention can be utilized to reduce the noise levels in other types of signals.

Consider a time varying display signal, $X(t)$, for $t=0$ to $T$ that is to be displayed by a test instrument. Either the signal itself or some function of the signal is actually displayed. The interval from 0 to T will be referred to as the measurement interval in the following discussion. $X(t)$ can be real or complex valued. Such signals are outputted and displayed by network analyzers and the like. The signal often includes a step function or other sharp edge and can have a dynamic range of several orders of magnitude.

It is assumed that this signal has noise that is to be removed by a filter bank prior to displaying the signal on the readout of a measurement instrument. As noted above, the noise can be divided into trace noise and a noise floor. The noise floor signal originates as the noise figure of the network analyzer receiver and/or the device under test. It may be modeled as a complex quantity with real and imaginary parts, each of which having a Gaussian probability distribution with the same standard deviation and zero mean. When the magnitude of a signal is viewed near the noise floor in a linear format, the noise on the trace has a Rayleigh probability distribution. When the signal is much larger than the noise floor, the noise on the trace has a Gaussian probability distribution with a standard deviation equal to that of the real and imaginary noise floor distributions.

The trace noise is typically caused by phase noise on the RF and LO signals in the network analyzer. It may be modeled as a complex quantity with real and imaginary parts, each of which having a Gaussian probability distribution with the same standard deviation and zero mean. When the magnitude of a signal is viewed on a logarithmic display, the peak-to-peak noise appears to be constant independent of the signal level.

In principle, one can average a large number of such signals from successive sweeps to reduce the noise. However, this strategy markedly increases the time needed for each measurement. If one attempts to remove the noise by low pass filtering the sweep signal, the sharp edge of the step function will be blurred. Such blurring distorts the measurements, and hence, is objectionable.

If the signal of interest has a different frequency spectrum from the noise, the noise can be reduced by performing a Fourier decomposition of the measured signal. That is, $X(t)$ is fitted to a sequence of sine or cosine functions. The coefficients of this series can then be processed to reduce the amplitude of those coefficients in the noise region of the frequency spectrum. The filtered signal is then generated by computing the inverse Fourier transform of the modified coefficients. Unfortunately, this approach has two significant limitations. First, the noise may vary over different parts of the measurement interval in a manner that prevents the signal and noise from being separated in the frequency domain. Second, any error introduced in the coefficients of the expansion during the de-noising transformation results in an error in the filtered signal that affects the signal over the entire measurement interval.

The present invention utilizes a wavelet filter bank to decompose $X(t)$ into a plurality of component signals representing the amplitude of the filtered signal in various frequency bands over sub-intervals of the measurement interval. The component signals in the higher frequency bands are processed by setting the signal amplitude to zero if the amplitude is less than a threshold value. The processed components are then recombined to form a filtered signal. Filters based on wavelets are well known to those skilled in the filter arts, accordingly, the theory of such filters will not be discussed in detail here. The reader is referred to Wavelets and Filter Banks by Gilbert Strang/Truong Nguyen, Wellesly-Cambridge Press, 1996, ISBN-0-9614088-7-1, for a more detailed discussion of the subject.

For the purposes of this discussion, it is sufficient to note that this filtering operation is equivalent to expanding $X(t)$ in an orthonormal expansion of wavelet basis functions, $W_i(t)$, $$X(t) = \Sigma C_i W_i(t)$$

altering the coefficients of this expansion, and then constructing the filtered signal by utilizing the expansion with the altered coefficients. Unlike a Fourier series, a wavelet expansion uses basis functions that are limited in time. That is, $W_i(t)$ is non-zero only over a limited portion of the measurement interval. However, the collection of functions $W_i(t)$ are non-zero over the entire measurement interval. Since $W_i(t)$ has a limited range, an error in $C_i$ can only introduce errors in $X(t)$ over the limited range of $W_i(t)$, and hence, the problems encountered in conventional Fourier-based filtering are substantially reduced. In addition, different $W_i(t)$ can be chosen such that they have different frequency dependencies, and hence, the coefficients represent the frequency content of $X(t)$ over different frequency bands. These properties allow the wavelet transform method to separate the noise and signal locally in the measurement interval by the frequency content of the signal.

The actual filtering operation is carried out via a perfect reconstruction filter bank constructed from finite impulse response filters that decompose the input signal into a number of component signals representing different frequency bands. The individual time points on each of the component signals represent the amplitude in the frequency band at the corresponding point on $X(t)$. The component signals are then processed to reduce their noise content. The processed component signals are then recombined with the aid of a second set of finite impulse response filters to generate the filtered signal. Since perfect reconstruction filter banks are well known in the art, such filter banks will not be discussed in detail here.

For the purposes of this discussion it is sufficient to consider a digital signal consisting of a sequence of values, each value representing the amplitude of the signal at a corresponding point in time. Denote the individual signal values by $X(i)$. A wavelet analyzer is a pair of finite impulse response filters that generates two digital signals, denoted by $YL(m)$ and $YH(m)$, from $X(i)$ by filtering the input signal and then down sampling the filtered signal. YL is generated by filtering the input signal with a low pass filter and then removing the odd-numbered samples. YH is generated by filtering the signal with a high pass filter and then removing the odd-numbered samples.

Depending on the application, the filtered signals, YL and YH can then be processed in a manner that takes advantage of the more limited frequency content of each signal relative to the input signal. Denote the processed signals by YL' and YH'.

After processing the signals, YL' and YH' are recombined by a synthesizer to generate the output signal, X'. The synthesizer also consists of two finite impulse response filters, one operating on the high frequency component signal and one operating on the low frequency component signal. Each filter starts by upsampling the signals input thereto by 2. This generates a signal having zeros in the odd-numbered sample positions. The upsampled filter is then filtered by convolving the upsampled signal with a set of coefficients to provide a filtered signal. The filtered signals generated from the high and low-frequency component signals are then added together to provide the processed output signal, $X'(I)$. It can be shown that the coefficients utilized by the various finite impulse response filters can be chosen such that $X'(I)=X(I-L)$, if $YH'=YH$ and $YL'=YL$. Here, L is related to the length of the coefficient set utilized in the finite impulse response filters. That is, in the absence of processing, the input signal is reconstructed at the output.

The coefficients used in the finite impulse response filters depend on the specific basis functions used in the wavelet expansion discussed above. The derivation of the specific coefficients is the subject of numerous textbooks, and hence will not be discussed here. In the preferred embodiment of the present invention, the analysis and synthesis filter banks utilize the Daubechies family of wavelets (Ingrid Daubechies. Orthonormal Bases of Compactly Supported Wavelets. Communications on Pure and Applied Mathematics, 41:909-996, November 1988).

Refer now to FIG. 1, which is a block diagram of a simple wavelet-based filter bank 10 having one analyzer and one synthesizer. Analyzer 11 separates the input signal 15 into the two component signals YH and YL. The high-frequency component is processed by circuit 12 to form a modified high frequency component signal YH'. YH' and YL are then recombined by synthesizer 13 to form the filtered output signal 14. In the preferred embodiment of the present invention, circuit 12 applies a "thresholding" transformation to YH. That is, if the absolute value of YH(k)≦T then YH(k) is set to zero. Here T is a threshold value. The manner in which T is determined will be discussed in more detail below. If YH(K)>T, either YH(k) is not altered or YH(k) is replaced by YH(k)−T. The former algorithm will be referred to as "hard" thresholding, and the latter algorithm will be referred to as "soft" thresholding.

Figure 2:
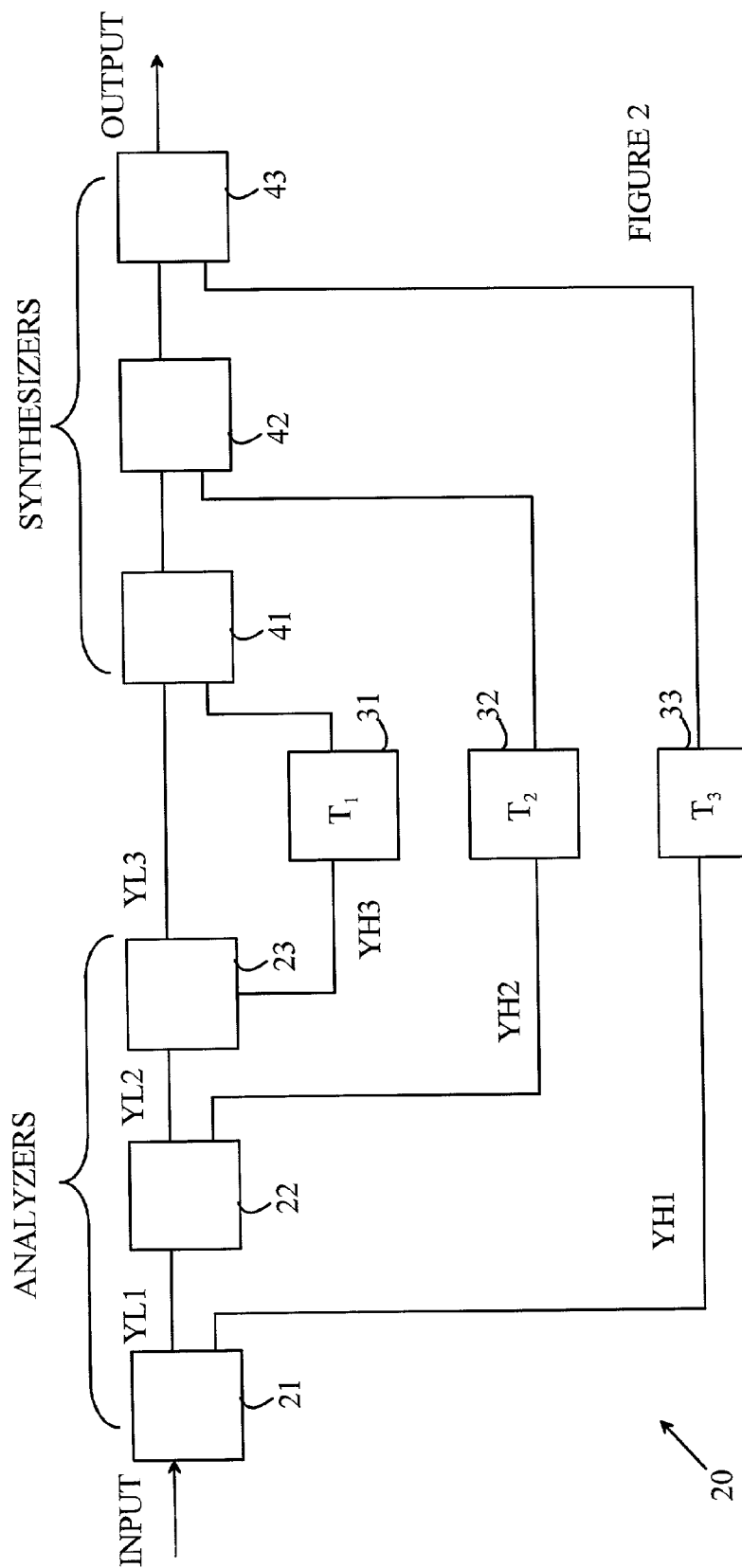
FIG. 2 is a block diagram of a tree-structured filter 20 according to the present invention.
Figure 3:
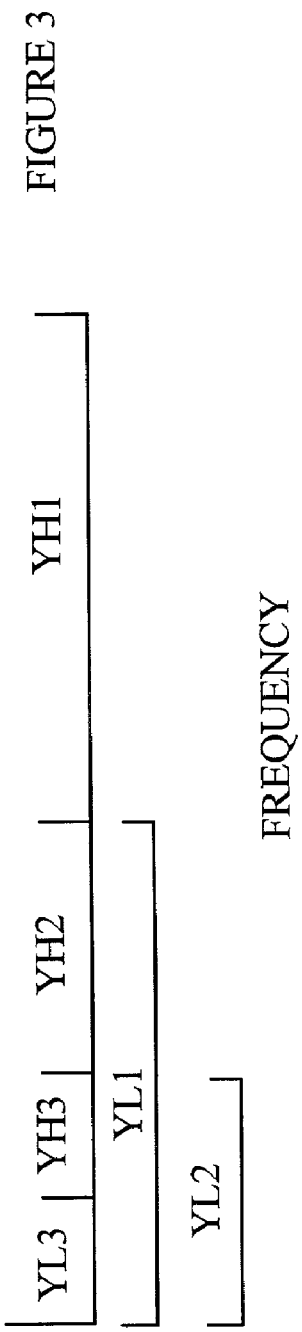
FIG. 3 is shows the frequency bands corresponding to the outputs of the various analyzers.

More complex filters can be constructed by combining a number of analyzers to form a tree structure, which generates a number of different component signals. The tree-structured analyzer iteratively decomposes the low frequency signal. Refer now to FIG. 2, which is a block diagram of a tree-structured filter 20 according to the present invention. Filter 20 utilizes 3 analyzers 21–23 to separate the input signal into one low frequency component and 3 high frequency components. The frequency bands corresponding to the outputs of the various analyzers are shown in FIG. 3.

Each of the high frequency components is processed by a corresponding thresholding circuit. The thresholding circuits are shown at 31–33. The processed high-frequency components are then recombined with the low frequency component by synthesizers 41–43. The thresholding circuits can utilize different amplitude cutoff values; however, in the preferred embodiment of the present invention, the same threshold value is utilized in each band.

In general, it is assumed that the signal of interest is band limited over at least a portion of the measurement interval. Over this portion of the interval, the output of the analyzers in the frequency bands above the signal frequency band will be primarily noise. Hence, these bands can be utilized to determine the proper threshold value. Alternatively, the filter can be programmed to utilize a threshold value that is input by the user or by the manufacturer. This latter approach is particularly useful in situations in which the noise levels result from components of the measurement instrument, and hence, can be determined at the time the instrument is manufactured.

Threshold-based de-noising algorithms are most effective in those cases in which the noise level is independent of the signal being measured. In network analyzers and similar instruments, the measured signal that is displayed can be parameterized as follows:

measured signal=actual signal*(Trace Noise+1)+Noise Floor, where the Trace Noise and Noise Floor are the noise signals introduced by the instrument. The Trace Noise is the dominant noise in the high signal intensity portions of the sweep as discussed above. Both of these noise signals are complex vectors. Since the Noise Floor is independent of the measured signal, a filter of the type discussed above is effective in removing the noise contribution from the regions of the signal in which the noise is dominated by the Noise Floor. Such a filter when applied to the measured signal will not work as well in removing the Trace Noise contribution since that noise is much larger in amplitude. However, the Trace Noise can be removed from the portion of the measured signal in which the actual signal is much greater than the Noise Floor by filtering a second signal equal to the log (measured signal). In this region, log(measured signal)≈log(actual signal)+log(Trace Noise+1), and hence, the Trace Noise component of the log (measured signal) is independent of the signal level. For a "logged" signal, the noise in those regions where the Noise Floor is dominant will be much larger in amplitude than in those regions where the Trace Noise is dominant. Therefore, filtering the Trace Noise will have little effect on the noise floor.

Figure 4:
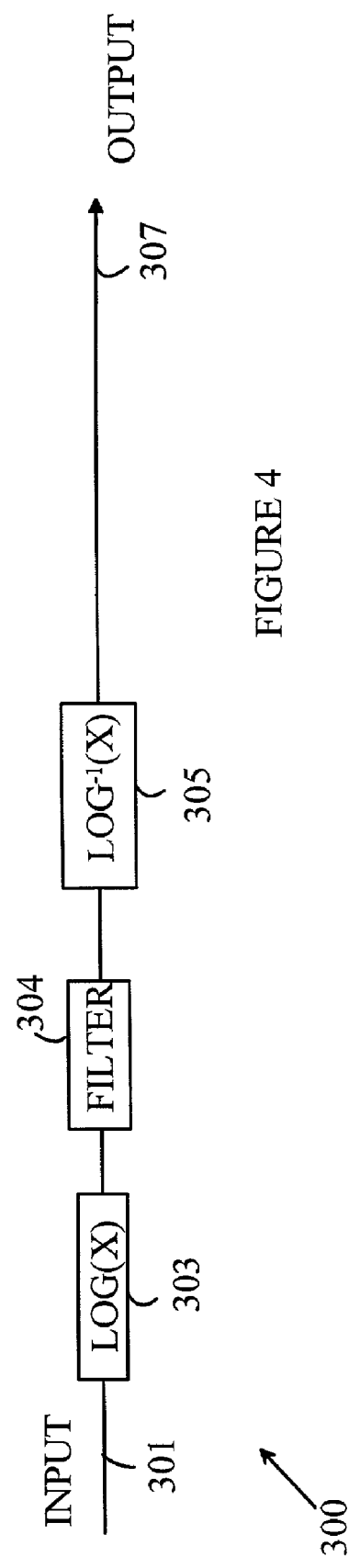
FIG. 4 is a block diagram of a de-noising filter 300 according to another embodiment of the present invention.

The above-described model is the basis of the embodiment of the present invention shown in FIG. 4, which is a block diagram of a de-noising filter 300 according to another embodiment of the present invention. The input signal on line 301 is input to a circuit 303 that generates a signal having an amplitude equal to the logarithm of the input signal. The signal is filtered through a wavelet filter 304. The output of the wavelet filter is then converted by anti-log circuit 305.

In general, the measured signal is complex. The signal can be represented in terms of its amplitude and phase or in terms of real and imaginary parts. In the preferred embodiment of the present invention, both the real and imaginary parts of the signal are separately filtered before constructing an amplitude display signal that is viewed by the user.

This is particularly important in the regions of the measured signal that are dominated by the noise floor. If only the amplitude signal is filtered, the resultant amplitude signal will have a systematic error, since the phase of such a signal is also very noisy, and this noise is not being removed if only the amplitude signal is filtered.

However, in the case of trace noise, a substantial improvement can be obtained by only filtering the amplitude portion of the complex signal, and hence reducing the computational complexity of the filtering process. As noted above, trace noise is removed by filtering a signal having an amplitude equal to that of the logarithm of the amplitude of the measured signal. It is assumed that the trace noise is relatively small. Hence, the contribution of the noise to the amplitude signal causes the amplitude to vary slightly in magnitude, with very little change in the phase of the signal. Hence, ignoring the noise in the phase creates only small errors in the resulting filtered amplitude signal.

There are a large number of possible wavelet filters that satisfy the relationships discussed above. In the preferred embodiment of the present invention, reconstruction filter banks are based on the Daubechies-3 wavelet. These wavelets are well adapted for representing smoothly varying functions that are approximated by quadratic equations. However, other wavelet-based reconstruction filter banks can be utilized in the present invention.

The preferred number of "branches" in the filter tree depend on the computational complexity that is acceptable to the user, the amount of noise reduction desired by the user and the extent to which the signal is band-limited. In principle, when using the half-band wavelet filters described above, each level of filtering will reduce the trace noise by a factor of approximately 0.7071 if the signal energy is contained in the low-frequency component of the filters for that level. However, once dividing the low frequency band into two bands no longer separates the signal from the noise, very little is gained by utilizing more branches.

The above-described embodiments of the present invention utilize a thresholding algorithm to reduce the noise. There are several methods for determining the noise threshold to be used. In the case of the trace noise, the noise is determined by the instrument itself. Hence, a predetermined value for the threshold can be inputted at the time of manufacturer. Alternatively, the filter can be programmed to accept an input value from the user that determines the noise threshold value.

In the case of the noise floor, the observed noise levels can be utilized to determine a thresholding value. If there are sufficient measurements in the region of the data that is dominated by the noise floor, as opposed to the trace noise, the correct threshold value can be determined from the high frequency signal components in this region. This is preferably accomplished by a suitable statistical analysis of the output of the first half-band high-frequency analysis filter in the region in which the trace noise is negligible.

Some instruments do not provide complex data measurements, i.e., the instrument measures only the amplitude of the input signal. For such signals, filtering the amplitude data is effective in filtering trace noise and noise floor. However, filtering such data in the region dominated by the noise floor will result in smoothing of the noise but no noise reduction.

In another embodiment of the present invention, a wavelet de-noising filter is utilized to reduce the noise floor. This embodiment of the present invention is based on the observation that the application of the threshold de-noising technique can be applied to a signal that is proportional to the square of the measured signal, i.e., proportional to the power, to reduce the noise floor. This de-noising step is performed in those regions of the measured signal in which the noise is dominated by the noise floor.

Figure 5:
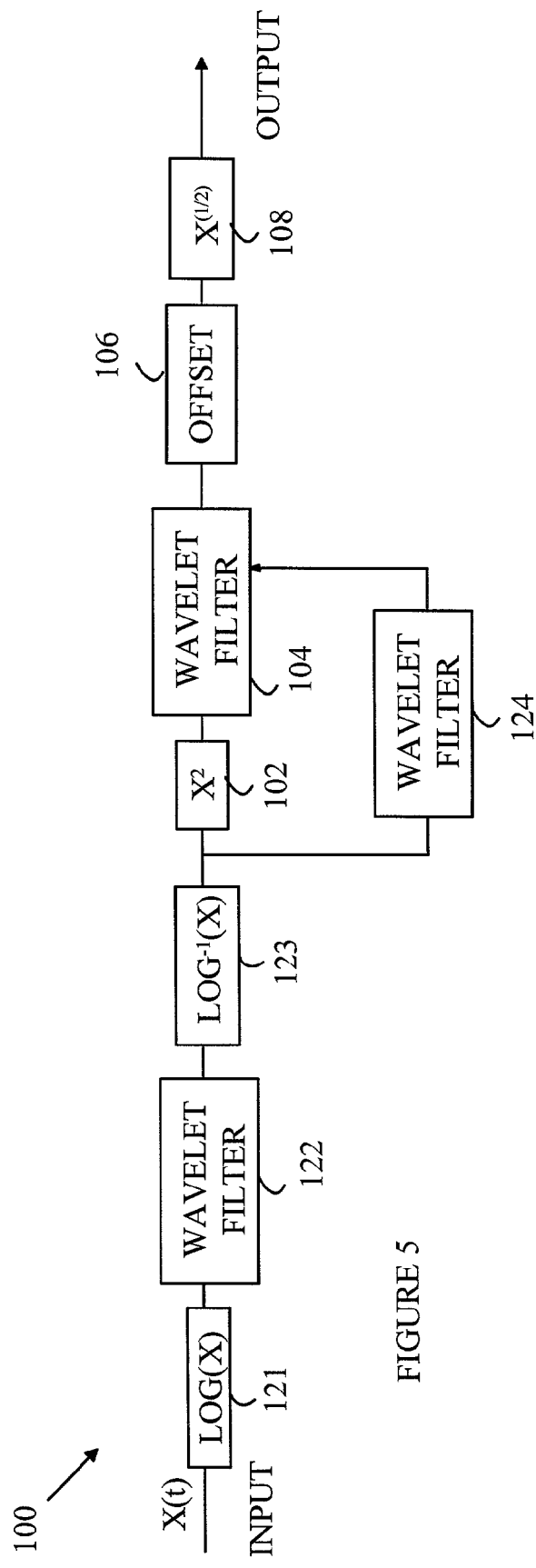
FIG. 5 is a block diagram of a filter 100 according to the present invention for reducing the noise floor in an instrument that measures only an amplitude signal.

Refer now to FIG. 5, which is a block diagram of a filter 100 according to the present invention for reducing the noise floor in an instrument that measures only an amplitude signal. The input signal X(t) is input to a circuit 121 that generates a signal having an amplitude equal to the logarithm of the input signal. The signal is filtered through a wavelet filter 122. The output of the wavelet filter is converted by an anti-log circuit 123. The output of the anti-log circuit is split into two paths. The first path is used to calculate the system noise floor. The signal enters a standard wavelet filter 124 similar to the filters described above; statistical analysis of this filter's output yields the noise floor of the system. In the second path, the signal is converted to power signal P(t) by circuit 102. The power signal is filtered using a wavelet filter 104 similar to the filters described above, however the noise threshold varies depending on the magnitude of the low-passed signal since the noise on a power signal is proportional to the signal level. All high-pass filter outputs of the analyzers are de-noised at a noise threshold using the soft thresholding algorithm described above. The output of filter 104 is a filtered power signal P'(t). The system noise floor power as previously calculated is subtracted from the signal by offset circuit 106. Then, square-root circuit 108 converts the filtered power signal back to an amplitude signal to be displayed.

The above-described two embodiments of the present invention can be combined in series to provide a filter that filters both the trace noise and the noise floor. In such a filter, the signal passes serially through one filter and then the other. Either filter may be applied first. The trace noise filtering has an insignificant effect on the regions of the signal dominated by the noise floor, and the noise floor filtering has insignificant effect on the regions dominated by trace noise. Neither filter has significant effect on large, high frequency components of the signal such as found at sharp edges, etc.

Various modifications to the present invention will become apparent to those skilled in the art from the foregoing description and accompanying drawings. Accordingly, the present invention is to be limited solely by the scope of the following claims.

What is claimed is:

1. A filter comprising:
an analyzer that generates a low-frequency component signal and a high-frequency component signal from an input signal;
a thresholding circuit that generates a processed high-frequency signal from said high-frequency component signal, said processed high-frequency signal having an amplitude of zero in those regions in which said high-frequency component signal has an amplitude that is less than a threshold value;
a synthesizer that generates a filtered signal from inputs comprising said low-frequency component signal and said processed high-frequency signal, said filtered signal being identical to said input signal if said threshold value is zero; and
a signal converter that generates said input signal from a measured signal by performing a non-linear mathematical transformation on said measured signal; and an inverse converter that applies the inverse mathematical transformation to said filtered signal to generate an output signal.

2. A filter comprising:
an analyzer that generates a low-frequency component signal and a high-frequency component signal from an input signal;
a thresholding circuit that generates a processed high-frequency signal from said high-frequency component signal, said processed high-frequency signal having an amplitude of zero in those regions in which said high-frequency component signal has an amplitude that is less than a threshold value;
a synthesizer that generates a filtered signal from inputs comprising said low-frequency component signal and said processed high-frequency signal, said filtered signal being identical to said input signal if said threshold value is zero; and
a signal converter that generates said input signal from a measured signal by performing a non-linear mathematical transformation on said measured signal: and an inverse converter that applies the inverse mathematical transformation to said filtered signal to generate an output signal,
wherein said signal converter generates a signal having an amplitude determined by the logarithm of said measured signal.

3. A filter comprising:
an analyzer that generates a low-frequency component signal and a high-frequency component signal from an input signal;
a thresholding circuit that generates a processed high-frequency signal from said high-frequency component signal, said processed high-frequency signal having an amplitude of zero in those regions in which said high-frequency component signal has an amplitude that is less than a threshold value;
a synthesizer that generates a filtered signal from inputs comprising said low-frequency component signal and said processed high-frequency signal, said filtered signal being identical to said input signal if said threshold value is zero; and a signal converter that generates said input signal from a measured signal by performing a non-linear mathematical transformation on said measured signal; and an inverse converter that applies the inverse mathematical transformation to said filtered signal to generate an output signal.

wherein said signal converter generates a signal having an amplitude determined by the square of said measured signal.

4. A filter comprising:

an analyzer for generating a low-frequency component signal and a high-frequency component signal from an input signal;

a thresholding circuit that generates a processed high-frequency signal from said high-frequency component signal, said processed high-frequency signal having an amplitude of zero in those regions in which said high-frequency component signal has an amplitude that is less than a threshold value; and a synthesizer that generates a filtered signal from inputs comprising said low-frequency component signal and said processed high-frequency signal, said filtered signal being identical to said input signal if said threshold value is zero, wherein said threshold value depends on the amplitude of said low-frequency component signal.

5. A filter comprising first and second thresholding filters operating in series on a filter input signal to provide a filtered output signal, said first thresholding filter comprising:

a first analyzer that generates a first low-frequency component signal and a first high-frequency component signal from a first input signal;

a first thresholding circuit that generates a first processed high-frequency signal from said first high-frequency component signal, said first processed high-frequency signal having an amplitude of zero in those regions in which said first high-frequency component signal has an amplitude that is less than a first threshold value; and a first synthesizer that generates a first output signal from inputs comprising said first low-frequency component signal and said first processed high-frequency signal, said first output signal being identical to said first input signal if said threshold value is zero; and said second thresholding filter comprising:

a first signal converter that generates an intermediate input signal from a second input signal by performing a non-linear mathematical transformation on said second input signal;

a second analyzer that generates a second low-frequency component signal and a second high-frequency component signal from said intermediate input signal;

a second thresholding circuit that generates a second processed high-frequency signal from said second high-frequency component signal, said second processed high-frequency signal having an amplitude of zero in those regions in which said second high-frequency component signal has an amplitude that is less than a second threshold value;

a second synthesizer that generates an intermediate output signal from inputs comprising said second low-frequency component signal and said second processed high-frequency signal, said intermediate output signal being identical to said intermediate input signal if said second threshold value is zero; and a first inverse converter that applies the inverse mathematical transformation to said intermediate output signal to generate a second output signal, wherein said first input signal is either said filter input signal or said second output signal and said second input signal is the other of said filter input signal and said second output signal.

6. The filter of claim 5 wherein said mathematical transformation comprises taking the logarithm of said second input signal.

7. A filter comprising first and second thresholding filters, each of said first and second thresholding filters comprising:

an analyzer for generating a low-frequency component signal and a high-frequency component signal from an input signal;

a thresholding circuit for generating a processed high-frequency signal from said high-frequency component signal, said processed high-frequency signal having an amplitude of zero in those regions in which said high-frequency component signal has an amplitude that is less than a threshold value; and a synthesizer for generating a filtered signal from inputs comprising said low-frequency component signal and said processed high-frequency signal, said filtered signal being identical to said input signal if said threshold value is zero, wherein said filtered signal generated by said first thresholding filter provides said input signal of said second thresholding filter, and wherein said first thresholding filter transforms said input signal input thereto in a manner that is different from the manner in which said second thresholding filter transforms said input signal input thereto.

8. The filter of claim 7 wherein said analyzer in one of said first and second thresholding filters comprises a plurality of finite impulse response filters.

9. The filter of claim 7 further comprising a second signal converter that generates said input signal to one of said first and second thresholding filters from a measured signal by performing a non-linear mathematical transformation on said measured signal; and a second inverse converter that applies the inverse mathematical transformation to said filtered signal generated by that one of said thresholding filter.

10. The filter of claim 9 wherein said second signal converter generates a signal having an amplitude determined by the logarithm of said input signal.

11. The filter of claim 9 wherein said second signal converter generates a signal having an amplitude determined by the square of said input signal.

12. The filter of claim 7 wherein said threshold value depends on the amplitude of said low-frequency signal generated by said one of said thresholding filters.

* * * * *

UNITED STATES PATENT AND TRADEMARK OFFICE
CERTIFICATE OF CORRECTION

| | |
|---|---|
| PATENT NO. | : 7,099,417 B2 |
| APPLICATION NO. | : 10/035593 |
| DATED | : August 29, 2006 |
| INVENTOR(S) | : Siegel et al. |

It is certified that error appears in the above-identified patent and that said Letters Patent is hereby corrected as shown below:

In column 8, line 49, in Claim 2, delete "signal:" and insert -- signal; --, therefor.

In column 9, line 9, in Claim 3, delete "signal." and insert -- signal, --, therefor.

Signed and Sealed this

Twentieth Day of February, 2007

JON W. DUDAS
*Director of the United States Patent and Trademark Office*